United States Patent [19]

Zeile et al.

[11] Patent Number: 4,862,248
[45] Date of Patent: Aug. 29, 1989

[54] CONTACTING SYSTEM FOR BIPOLAR ELECTRONIC CIRCUIT ELEMENTS, MORE PARTICULARLY SEMICONDUCTOR CIRCUIT ELEMENTS

[75] Inventors: Henrich Zeile, Hamburg; Heinz Sauermann, Halstenbek, both of Fed. Rep. of Germany

[73] Assignee: U.S. Philips Corporation, New York, N.Y.

[21] Appl. No.: 694,187

[22] Filed: Jan. 23, 1985

[30] Foreign Application Priority Data

Jan. 28, 1984 [DE] Fed. Rep. of Germany ....... 3402970

[51] Int. Cl.[4] ............... H01L 23/42; H01L 23/02
[52] U.S. Cl. ........................... 357/79; 357/26; 357/61; 357/68; 357/74
[58] Field of Search ............ 357/79, 61, 26, 74, 357/68

[56] References Cited

U.S. PATENT DOCUMENTS 3,551,757  12/1970  Kristensen et al. ............... 357/79
4,402,004   6/1983  Iwasaki ............................ 357/79

FOREIGN PATENT DOCUMENTS 3221794  12/1983  Fed. Rep. of Germany ........ 357/79

Primary Examiner—William L. Sikes
Assistant Examiner—Georgia Y. Epps
Attorney, Agent, or Firm—Paul R. Miller

[57] ABSTRACT

In a contacting system for bipolar electronic circuit elements, more particularly semiconductor circuit elements, in which a circuit element body provided on at least one of two major surfaces located opposite each other with a thick, pressure-contact layer is held under pressure between two contact bodies interconnected by a housing, more particularly a soft glass housing. The risk of contact interruptions with frequent temperature variations in a range of from 0° to 300° C. is eliminated in that the thick pressure contact layers are subdivided into several contact blocks, preferably three or four, which are mutually separated and arranged beside each other.

The surface of the contact blocks facing the contact bodies may be coated with a connection layer, which serves to establish during sealing into a soft glass envelope a connection by soldering or diffusion welding between the contact blocks and the contact bodies.

16 Claims, 1 Drawing Sheet

CONTACTING SYSTEM FOR BIPOLAR ELECTRONIC CIRCUIT ELEMENTS, MORE PARTICULARLY SEMICONDUCTOR CIRCUIT ELEMENTS

The invention relates to a contacting system for bipolar electronic circuit elements, more particularly semiconductor circuit elements, in which a circuit element body is held under pressure between contact bodies interconnected by a housing with the circuit element being provided with a thick, pressure-contact layer on at least one of two major surface located opposite each other.

BACKGROUND OF THE INVENTION

Semiconductor diodes having such a contacting system are known. Such semiconductor diodes comprise a circuit element body (silicon crystal), which is metallised on both major sides, which circuit element body is placed in a housing of soft glass. Apart from adhesion layers, use is generally made for this purpose on the front side of the crystal of a comparatively thick silver layer of large surface area (thickness about 5 to 20% of the thickness of the circuit element body, diameter more than 100 $\mu$m) and on the back side of the circuit element body of a thin silver layer of large surface area. The silicon body is then sealed into a glass tube, two connection wires engaging the said silver layers with their end faces. If a heat treatment is carried out up to the softening point of the soft glass (about 700° C.), the soft glass wets the sheath surfaces of the connection wires, while upon cooling the soft glass shrinks a little so that the connection wires are pressed against the silver layers.

Consequently, the circuit element body is electrically connected to the connection wires by pressure contacting. Upon sealing, the silver layers neutralize the occurring forces since the silver is deformed in an irreversible manner.

If a circuit element thus contacted is caused to operate at comparatively high temperatures and with frequent temperature variations, the problem arises that the thick silver metallization of large surface area has a considerably larger heat expansion than the silicon crystal covered thereby. With frequent strong temperature variations, shear stresses at the interface between the silicon and the silver may lead to such strong irreversible deformations of the metallization that the circuit element becomes defective. Furthermore, the temperature variation is also accompanied by pressure variations in the axial direction so that the metallization may be subjected to an axial creepage deformation. Finally, the resulting reduction in pressure may mechanically and electrically interrupt the connection between the metallization and the adjoining connection wire.

West German patent No. 3122387 discloses a glass diode which is metallized with titanium and copper. Furthermore, a tin layer is present, which upon sealing establishes a soldering connection of copper/tin/copper. The mechanical otherwise usual pressure contact is consequently replaced in this circuit element by a soldering connection.

A circuit element known from West German patent No. 2643147 is constructed in a similar manner, in which a gold/germanium layer on silver is used.

In the latter two known circuit elements, the risk of contact interruptions could be reduced with respect to the usual pressure contact. However, the problem of the lateral deformations explained above is not solved. Therefore, the invention has for its object to construct a contacting system of the kind mentioned in the opening paragraph in a manner such that it behaves in a mechanically and electrically stable manner at operating temperatures up to 300° C. and with frequent temperature variations.

SUMMARY OF THE INVENTION

According to the invention, this object is achieved in that the pressure contact layer on at least one of the major surfaces of the circuit element body is subdivided into at least two mutually separated contact blocks.

Such a contacting system can be manufactured in a simple manner by means of the techniques usual in the manufacture of semiconductor circuit elements and is mechanically and electrically stable at operating temperatures up to at least 300° C. and with frequent temperature variations.

Further embodiments of the invention include that the contact blocks are uniformly distributed over the major surface of the circuit element body. Also, the contact blocks may be of a square shape, a columnar shape, a semispherical shape, or a mushroom shape. For example, four mushroom shaped contact blocks could be arranged on each of the opposite major surfaces of the circuit element body.

The metallization system according to the invention can be used successfully in a housing of soft glass at temperatures up to about 300° C. The pressure contact layer is subdivided into several contact blocks, preferably three or four, which are arranged beside each other. In order to avoid lateral deformations, it is then important that the maximum diameter of the contact blocks at the interface with the circuit element body is smaller than a given critical diameter. This diameter is determined by the condition that during a temperature variation the shear stresses at the interface do not yet reach the flow limit of the metal and/or do not yet produce crystal eruptions. The shear stresses increase with an increasing diameter, while the flow limit specific for the material decreases with an increasing temperature. For an operating temperature interval of from 0° C. to 300° C. and for contact blocks of electroplated silver or silicon, the critical maximum diameter is about 100 $\mu$m.

The sum of the heights of the contact blocks on both major surfaces of the circuit element body is preferably more than ⅓ of its thickness. It is preferably chosen so that thermal expansions of the circuit element body, of the contact blocks and of the (soft glass) housing mechanically interconnecting the contact blocks compensate each other in the axial direction. Thus, the axial pressure in these three parts of the contacting system becomes independent of the temperature.

The contact blocks are arranged on a thin metal layer, which acts as a contact layer and which connects all contact blocks electrically to the part of the circuit element body to be contacted.

Preferably, the surface of the contact blocks facing the contact bodies has applied to it a connection layer, which serves to establish by soft-soldering, hard-soldering or diffusion welding a connection between the contact blocks and the contact bodies during the manufacture (for example sealing into an envelope of soft glass at about 700° C.). Such a connection is mechanically and electrically stable in an operating temperature range of from 0° C. to 300° C.

A so-called stopper layer may further be provided between the contact blocks and the connection layer in order to ensure that the material of the connection layer is preferentially directed towards the contact bodies, which preferably consist of copper at the surface facing the connections.

BRIEF DESCRIPTION OF THE DRAWINGS

In order that the invention may be readily carried out, it will now be described more fully, by way of example, with reference to the accompanying drawings, in which.

The Figures are not drawn to scale in the direction of thickness.

DESCRIPTION OF PREFERRED EMBODIMENTS

Figure 1:
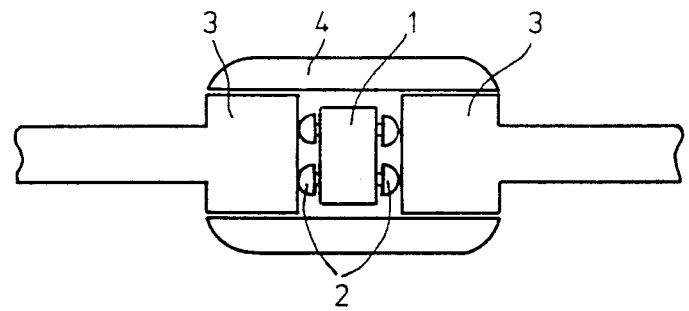
FIG. 1 is a longitudinal sectional view of a semiconductor circuit element arranged in a soft-glass T-housing.
Figure 2:
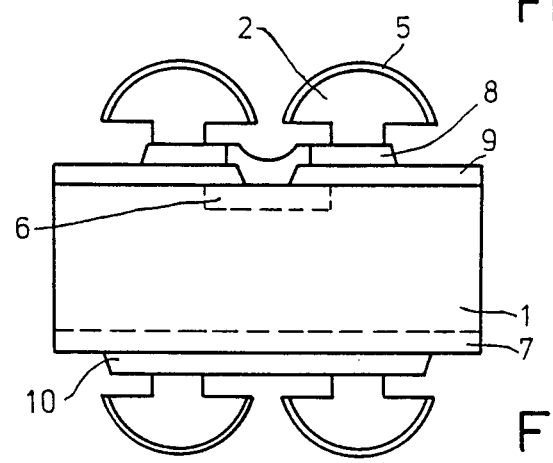
FIG. 2 is a sectional view of the semi-conductor body of the circuit element shown in FIG. 1.
Figure 3:
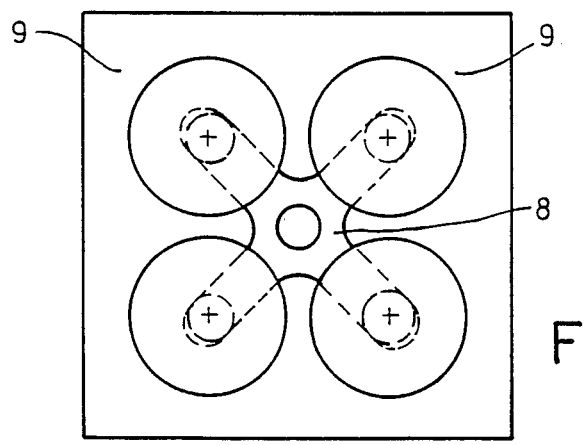
FIG. 3 is a plan view of one of the major surfaces of this semiconductor body.

The semiconductor circuit element shown in sectional view in FIG. 1 is a temperature sensor of monocrystalline silicon, which is described, for example, in West German patent No. 3041818. The circuit element operates according to the current spreading principle and the semiconductor body 1 is arranged in a soft-glass housing according to the standard DO 34, which housing consists of two contact bodies (3), which serve at the same time as connection wires, and of a housing 4 of soft glass. The silicon crystal 1 carries contact blocks 2 on both major surfaces, which contact blocks 2 are in pressure contact with the contact bodies 3. The silicon monocrystal 1 is about 250 $\mu$m thick and has a surface area of about 500×500 $\mu$m. The zone 6 to be contacted on the upper major surface of the crystal 1 extends only at its center. The residual part of this surface is coated with an insulating and passivating layer 9 of silicon oxide and silicon nitride. A cross-shaped contact layer 8 of titanium/tungsten (50 at.% each) having a thickness of 0.4 $\mu$m extends on this layer 9 and on the exposed part of this surface to be contacted above the zone 6 and on this layer 8 a gold layer having a thickness of 0.6 $\mu$m is disposed.

The lower major surface of the silicon crystal 1 is contacted over its hole surface; therefore, it does not carry an insulating layer, but it only carries a square contact layer 10 having the same composition as the layer 8 on the upper major surface.

In a system thus far manufactured, a lacquer mask is applied to each of the major surfaces of the silicon crystal 1. It is 4 $\mu$m thick and has four windows of 60 $\mu$m diameter each, which are located at a relative distance of 210 $\mu$m. Under the protection of this lacquer mask, silver is then applied by electrodeposition so that mushroom-shaped contact blocks 2 are formed having a height about 60 $\mu$m and which have a maximum diameter of 180 $\mu$m. Subsequently, a 5 $\mu$m thick connection layer 5 consisting of tin is deposited on these mushroom-shaped contact blocks, after which the lacquer mask (not shown in the Figure) is removed.

The silicon crystal 1 thus provided with contact blocks 2 are then sealed into the soft glass housing shown in FIG. 1 at a temperature of about 670° C. The tin layer 5 alloys with the copper of the contact bodies 3 and with the silver of the contact blocks 2. The contact bodies 3 of course need not consist entirely of copper; it is sufficient when they consist of copper only at the end faces connected to the contact blocks 2.

Alternatively, the contact blocks may consist of nickel, the connection layer of gold, aand the contact bodies of copper. Also, the contact blocks may consist of copper, the stopper layer of cobalt, the connection layer of gold, and the contact bodies of copper.

What is claimed is:

1. A contacting system for bipolar electronic circuit elements comprising a housing structure, a circuit element contained in said housing structure, a plurality of separated electrical contact blocks provided on each opposite surface of said circuit element within said housing structure, and electrical contact bodies provided at opposite sides of said circuit element to make contact with said contact blocks within said housing structure, said contact bodies holding said circuit element in said housing structure under pressure.

2. A contacting system according to claim 1, wherein said plurality of separated contact blocks are uniformly distributed over each said surface of said circuit element.

3. A contacting system according to claim 1, wherein each of said plurality of contact blocks has one of a square form, a columnar form, a semispherical form, and a mushroom form.

4. A contacting system according to claim 1, wherein a contact layer is provided between said plurality of contact blocks and each of said opposite surfaces of said circuit element.

5. A contacting system according to claim 1, wherein said plurality of contact blocks at each of said opposite surfaces of said circuit element are four mushroom shaped contact blocks.

6. A contacting system according to claim 1, wherein each of said plurality of contact blocks has a total thickness of at least one third of the thickness of said circuit element.

7. A contacting system according to claim 6, wherein said total thickness of each of said plurality of contact blocks is provided so that thermal expansion of each of said circuit element, of said contact blocks, and of said housing structure compensate each other in the axial direction.

8. A contacting system according to claim 1, wherein each of said plurality of contact blocks has a maximum dimension at an interface with said circuit element, said maximum dimension being sufficiently small to minimize permanent deformation of said contact blocks and said circuit element by shear stress upon temperature variation.

9. A contacting system according to claim 8, wherein said circuit element is silicon, and said contact blocks are silver, and wherein said maximum dimension is smaller than 100 $\mu$m.

10. A contacting system according to claim 1, wherein each of said plurality of contact blocks have a coating of a connection layer, said connection layer being of a material to provide connection between said plurality of contact blocks and said contact bodies at a temperature lower than 700° C., said connection being stable at operating temperatures of said circuit element.

11. A contacting system according to claim 10, wherein a stopper layer is disposed between said connection layer and each of said plurality of contact blocks, said stopper layer preventing mixing between said connection layer and each of said plurality of contact blocks.

12. A contacting system according to claim 11, wherein said contact blocks are copper, said stopper layer is cobalt, said connection layer is gold, and said contact bodies are copper.

13. A contacting system according to one of claims 10 or 11, wherein said contact blocks are silver, said connection layer is tin, and said contact bodies are copper.

14. A contacting system according to one of claims 10 or 11, wherein said contact blocks are nickel, said connection layer is gold, and said contact blocks are copper.

15. A contacting system according to one of claims 1-8, 10-11 wherein said circuit element is silicon.

16. A contacting system according to one of claims 1-11, wherein said housing structure is soft glass.

* * * * *